United States Patent [19]
Anderson et al.

[11] Patent Number: 5,851,041
[45] Date of Patent: Dec. 22, 1998

[54] WAFER HOLDER WITH SPINDLE ASSEMBLY AND WAFER HOLDER ACTUATOR

[75] Inventors: Donald E. Anderson, Morgan Hill, Calif.; James H. Hammar, Santa Cruz, Calif.

[73] Assignee: OnTrak Systems, Inc., San Jose, Calif.

[21] Appl. No.: 670,648

[22] Filed: Jun. 26, 1996

(Under 37 CFR 1.47)

[51] Int. Cl.[6] .............................. B25J 15/10; B25B 5/14
[52] U.S. Cl. ...................... 294/106; 294/88; 294/115; 294/907; 414/941; 34/58
[58] Field of Search .............................. 294/88, 106, 115, 294/116, 119.1, 907; 414/744.8, 783, 935, 936, 941; 901/37, 46; 34/58, 312, 317

[56] References Cited

U.S. PATENT DOCUMENTS

| | | | |
|---|---|---|---|
| 4,313,266 | 2/1982 | Tam | 34/8 |
| 4,651,440 | 3/1987 | Karl | 34/58 |
| 4,696,503 | 9/1987 | Collodel | 294/88 |
| 4,723,503 | 2/1988 | Yuda | 294/88 |
| 4,735,452 | 4/1988 | Nemoto | 294/119.1 |
| 5,520,501 | 5/1996 | Kouno et al. | 414/941 |
| 5,549,444 | 8/1996 | Dubuit | 414/941 |
| 5,566,466 | 10/1996 | Hearne . | |

FOREIGN PATENT DOCUMENTS 2138737  5/1990  Japan .

OTHER PUBLICATIONS

A.H. Higginson and K.H. Stokes "Disk Support For Spin Drying" IBM Technical Disclosure Bulletin vol. 18, No. 6, Nov. 1975 pp. 1979–1980.

*Primary Examiner*—Dean Kramer
*Attorney, Agent, or Firm*—Blakely, Sokoloff, Taylor & Zafman

[57] ABSTRACT

An improved wafer holder with spindle assembly and wafer holder actuator is disclosed. In one embodiment, the vertical motion of a shaft drives an arm positioning member in a rotational motion. The arm positioning member is coupled to a first position of an arm such that the arm moves in a horizontal motion when the arm positioning member rotates. A substrate holding member is coupled to the arm at a second position, such that the horizontal motion of the arm moves the substrate holding member between an open and a closed position. The shaft of the above described embodiment is moved in a vertical motion by an actuator. A first cylinder of the actuator expands and engages a spring which moves the shaft upward and a second cylinder of the actuator retracts to disengage the first cylinder thereby moving the shaft downward.

34 Claims, 10 Drawing Sheets

5,851,041

WAFER HOLDER WITH SPINDLE ASSEMBLY AND WAFER HOLDER ACTUATOR

BACKGROUND OF THE INVENTION

1. Field of the Invention

The present invention relates to an improved method and apparatus for holding a wafer by its edges, and more particularly to a method for holding a wafer by its edges during a spin operation such as a spin dry operation after a wafer scrubbing operation.

2. Background Information

In the fabrication of semiconductor devices, numerous wet clean steps are performed on a substrate, such as a semiconductor wafer, at various stages throughout the fabrication process. In some cases these wet clean steps may comprise scrubbing the wafer with a brush, and may comprise one or more spin rinses wherein the wafer is sprayed with one or more cleaning solutions and/or water while the wafer is spinning. Finally, the wafer is spun dry at a high rate of speed, typically in the 1800–5000 revolution per minute (RPM) range. In many cases, only the front side of the wafer upon which devices are to be formed is cleaned, so that the wafer may be held on its back side by a vacuum chuck. In many other instances, it is desirable to clean both sides of a wafer. For example, semiconductor substrate manufacturers typically scrub both sides at the completion of the slice manufacturing process. Additionally, other processes may require scrubbing, wherein both sides of the wafer are scrubbed. For example, chemical mechanical polishing (CMP), is carried out in a slurry, which is an extremely dirty environment by semiconductor fabrication standards. Therefore, both sides of the wafer must be scrubbed after the CMP operation to remove all contamination prior to subsequent processing. Finally, scrubbing, wherein both sides of a wafer are scrubbed, may be used in any application where it is desired to keep the back side of the wafer clean, for example, to reduce contaminants introduced into equipment and/or the process from the back side of the wafer.

In the scrubbing process, wherein both sides of a wafer are scrubbed, described above, the wafer cannot be held on the back side during the spin dry operation as is done when only the front side of the wafer is cleaned, since the back side of the wafer must be spun dry as well. To provide for spin drying of both the back and front sides, a wafer holder which grips the wafer on its edges has been used in the prior art. Referring to FIG. 1A, an isometric view of a prior art wafer holder is shown. Nest 101 in which the substrate 105 is held is formed by two slide members 106 each having U shaped uprights 107. Wafer holding bumpers 110 are disposed at the top of the upper portion of the uprights as shown. Each of the wafer holding bumpers 110 has a circumferential groove 111 which grip the wafer 105 by its edge. Slide members 106 can move inwardly and outwardly as shown by arrows 115. In particular, the slide members 106 move outwardly to open the nest to release a wafer 105 to some type of conveyor mechanism. Once the nest is in the open position, the next wafer may be placed within the open nest. The slide members 106 then move inwardly to grip this next wafer.

Referring to FIG. 1B, a cross-sectional view of the structure shown in FIG. 1A is illustrated. As shown, slide members 106 comprises slots 120. Cam roller 125 engages both of slots 120. Cam roller 125 is coupled to rod 126 which is disposed within spindle 117. As rod 126 moves in an upward direction, it pushes slide members 120 outwardly to the open position described previously. As rod 126 moves in a downward direction, cam roller 125 pulls slide members 120 in an inwardly or closed position to hold the wafer. Rod 126 is moved up and down by cylinder 130. In operation, cylinder 130 moves cylinder rod 131, connector bar 132, and collar 135 in an up and down direction. Collar 135 is coupled to rod 126 by pin 133. Spring 137, held by stop member 138, puts a downward bias on collar 135.

It will be appreciated that while cylinder 130 is capable of opening and closing the wafer holder of FIG. 1, it cannot be relied on to reliably maintain sufficient force on the wafer to hold it without causing breakage, during all phases of operation. This is because while the wafer is spinning at high speed, a large centrifugal force is generated requiring a correspondingly large inward force on slide members 106 to hold the wafer. Therefore, the far end of the wafer holder, illustrated by portion 156 comprises counterweighting. During the spinning operation, a centrifugal force is created such that the weight at 156 is pulled in an outward direction, thereby pulling the portion of slide members 106 having uprights 107 and wafer holding bumpers 106 in an inward direction to keep the wafer holder in the closed position. This method suffers from the disadvantage that if the counterweight is imprecisely positioned, and/or the weight of the counterweights is different from the specified value, the centrifugal force will vary. Too great a centrifugal force may result in warpage of bendable substrates such as aluminum, and breakage of inflexible substrates such as semiconductor substrates. An insufficient centrifugal force results in the possibility that the wafer will be flung off the holder during the spinning operation. Further, even if the positioning and weight of the counterweights are within specifications, it will readily be appreciated that at the beginning and the end of the spinning operation, when the rotational speed is small, the centrifugal force will be correspondingly small. Thus, the wafers may be flung from the wafer holder at this point. The situation is further complicated by the fact that the forces operating on the wafer holder vary greatly depending on the stage of operation, i.e., whether stopped, accelerating, spinning at high speed, or decelerating.

Another disadvantage in the assembly of cylinder 130 and rod 126 is that as cylinder 130 pulls rod 126 in a downward direction, thereby putting slide members 120 in a closed position, the force of the cylinder corresponds to the force (or pressure) that is exerted by the slide members 120 on the wafer. Typically cylinder 130 is activated using air pressure. Thus, if the air pressure activating cylinder 130 fluctuates (i.e. is not constant) then the force exerted by cylinder 130 and consequently by slide members 120 must also fluctuate, thereby placing varying force on the wafer. If, for example, the fluctuation in the air pressure causes the force of the cylinder to increase then slide members 120 would be forced further inward causing an increase in the pressure that is exerted by slide members 120 on wafer 105. Such an increase in the pressure on wafer 105 may break the wafer or cause the wafer to warp or crack. If, for example, the fluctuation in the air pressure causes the force of the cylinder to decrease then slide members 120 would be forced outward causing a decrease in the pressure that is exerted by slide members 120 on the wafer 105. Such a decrease in the pressure on wafer 105 may cause the wafer to slip, bounce back and forth, or let go of the wafer entirely, thereby allowing the wafer to become damaged, chipped, cracked, broken, etc.

What is needed is a wafer holder and actuator assembly which can be used to hold a wafer in a rotatable spindle without touching the top or bottom surfaces of the wafer.

The holder must not release or damage the wafer, must not be speed sensitive, and must not be capable of being opened accidentally.

SUMMARY OF THE INVENTION

An improved wafer holder with spindle assembly and wafer holder actuator is disclosed. In one embodiment, the vertical motion of a shaft drives an arm positioning member in a rotational motion. The arm positioning member is coupled to a first position of an arm such that the arm moves in a horizontal motion when the arm positioning member rotates. A substrate holding member is coupled to the arm at a second position, such that the horizontal motion of the arm moves the substrate holding member between an open and a closed position. The shaft of the above described embodiment is moved in a vertical motion by an actuator. A first cylinder of the actuator expands and engages a spring which moves the shaft upward and a second cylinder of the actuator retracts to assist the first cylinder in moving the shaft downward.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

An Improved Wafer Holder with Spindle Assembly and Wafer Holder Actuator is disclosed. In the following description, numerous specific details are set forth such as specific materials, dimensions, configurations, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention. Additionally, although the present invention is described in conjunction with a spin drying operation performed on a semiconductor wafer after a double sided scrubbing operation, it will be appreciated that the substrate holder of the present invention may be used to hold any substrate during any processing operation, particularly where spinning without contacting either the front or back surface of a substrate is desired.

Figure 2:
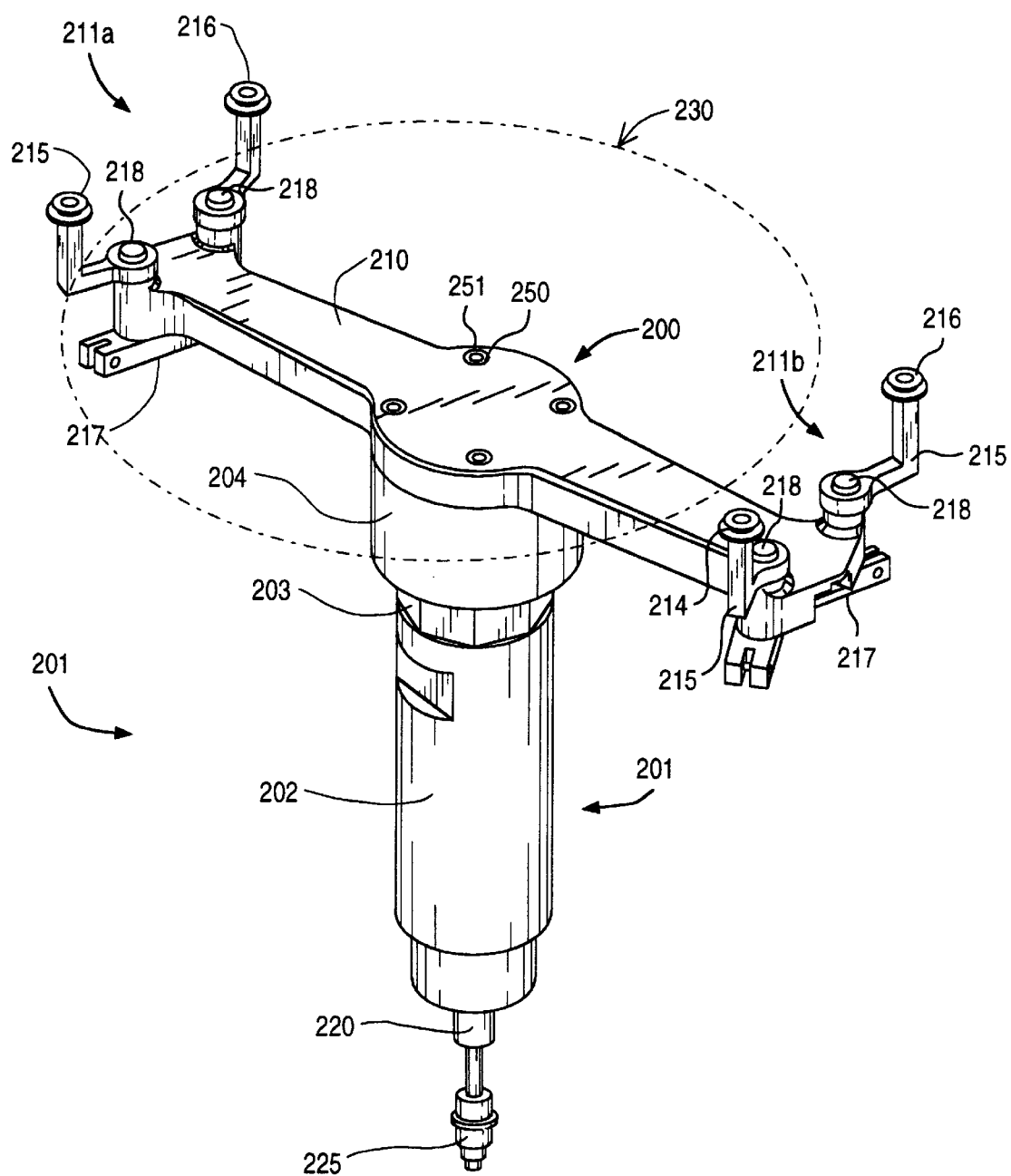
FIG. 2 shows the spindle assembly and wafer holder of a currently preferred embodiment of the present invention in an open position.

FIG. 2 shows a side view of a currently preferred embodiment of wafer holder 200 mounted on spindle assembly 201. Spindle assembly 201 comprises housing 202, retaining nut 203, and head 204. Wafer holder 200 comprises housing 210 and two wafer holding members 211a and 211b (hereinafter referred to collectively as wafer holding members 211). Wafer holder 200 is mounted on spindle assembly 201 by hex head screws 251 which extend through openings 250 in housing 210, and through openings (not shown) in head 204, and which screw into spindle assembly 201. Each wafer holding member 211 comprises two generally L-shaped members 215, each having a wafer holding bumper 216 on the top thereof. Each of the L-shaped members 215 is further coupled to a pin 218 extending through a portion of housing 210. Each pin 218 is coupled to a pivoting arm 217. Housing 210 further comprises two arms (not shown in FIG. 2) each coupled to both of the L-shaped members 215 (via the above described pin 218 and pivoting arm 217) of one of wafer holding members 211. The coupling of the arms to the pivoting arms 217, will be discussed in more detail in relation to FIGS. 6–8.

In a currently preferred embodiment, most of the portions of wafer holder 200 including housing 210, L-shaped members 215, pivoting arms 217, are made of anti-friction coated hard anodized aluminum. The various screws used to hold the parts together are hex type socket head cap screws made of stainless steel. The wafer bumpers 216 are made of Delrin™, as is head 204. Also in a currently preferred embodiment, pins 218 and spindle assembly 201 including housing 202, spindle 220, and rod 225 are made of stainless steel. It will be appreciated that other materials may be used depending upon the environment in which the wafer holder is used.

In typical use, spindle assembly 201 and wafer holder 200 are mounted in, for example, the spin rinse/dry station of a wafer scrubbing system by fixably attaching housing 202 to the body of the system in which the spinner is placed. A motor is coupled to spindle 220, for example, by a belt. It will be appreciated that the present invention may be utilized in a variety of systems having a variety of types of spindles and means for rotating the spindle. Referring again to FIG. 2, rod 225 is disposed within and is moveable up and down within shaft 220. Rod 225 is moved up and down by a mechanism such as an actuator as will be described in greater detail in the discussion of FIGS. 9–13 below. Rod 225 is further coupled to the arms in housing 210, such that when rod 225 is moved up and down, wafer holding members 211 move between an open and a closed position. For example, in FIG. 2, rod 225 is in the down position so that wafer holding members 211 are in the open position shown. In this position, both of the L-shaped members 215 on both wafer holding members 211 are rotated back away from the center of wafer holder 200. The operation of rod 225 in opening and closing the wafer holder 200 will be described in more detail in relation to FIGS. 6–8.

The region between the wafer holding members 211, often referred to as the "nest," is, in the open position, larger than the diameter of wafers to be held in wafer holder 200 so that a wafer may be loaded into wafer holder 200. For example, a belt assembly, vacuum wand, or robotic arm may place a wafer centered in the nest of wafer holder 200 when wafer holder 200 is in the open position shown in FIG. 2. Wafer 230 is shown in dashed outline form, in the position in which the loading mechanism (not shown) places it during loading and from which the loading mechanism removes it during unloading.

Figure 3:
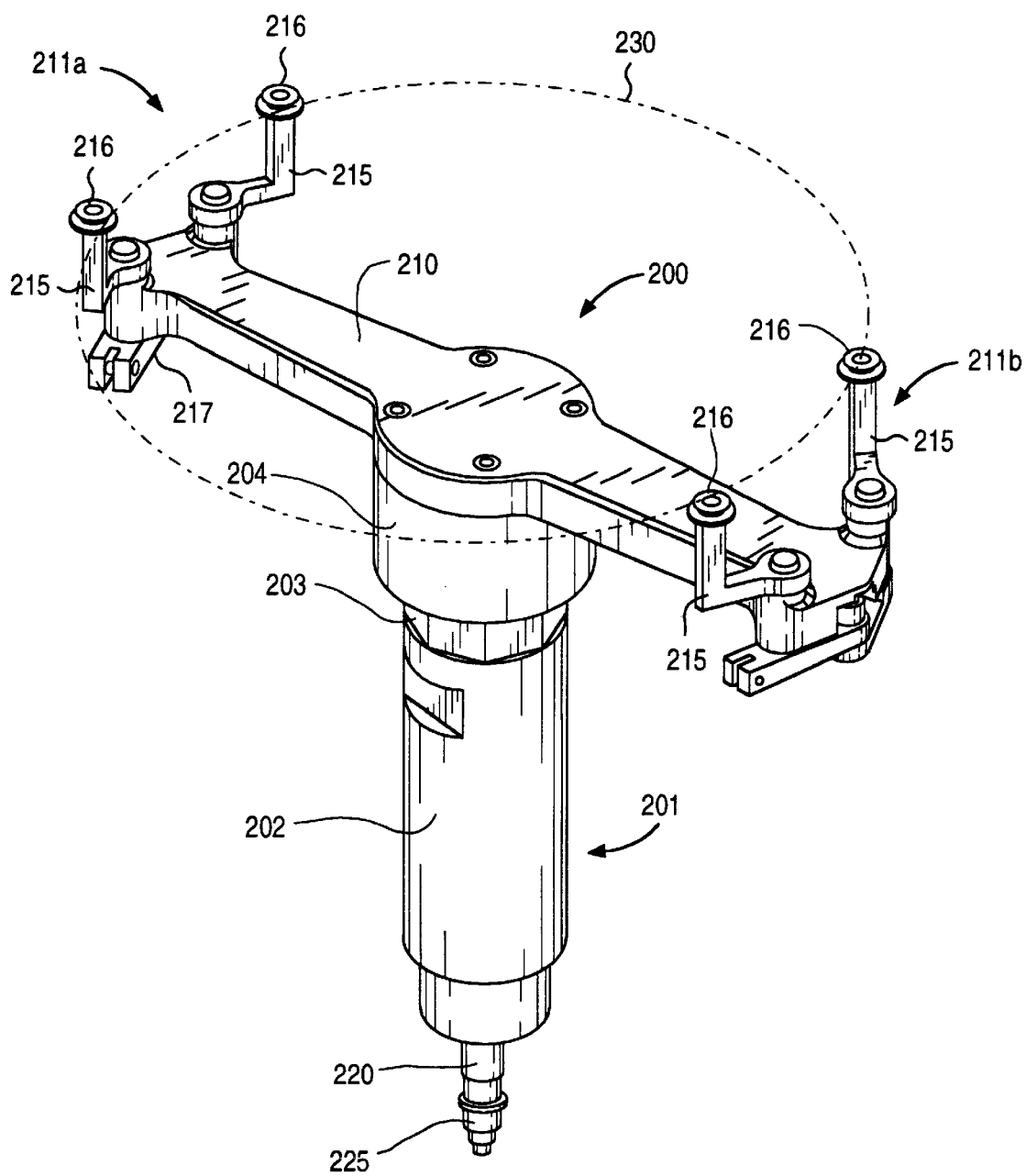
FIG. 3 shows the wafer holder and spindle assembly of a currently preferred embodiment of the present invention in a closed position.

Referring to FIG. 3, wafer holder 200 is shown in the closed position. In this position, each of the L-shaped members 215 is swung inward towards the center of the wafer holder 200. In this position, the wafer holding members 211 are positioned such that a wafer of a given diameter snugly fits with its edges positioned in the indentation in each of the four bumpers 216. The positioning of a wafer 230 is again shown in dashed outline form. As can be seen, the wafer is disposed within the indentations in bumpers 216. As shown, rod 225 has been pushed up, thereby putting each of the L-shaped members 215 in the closed position shown. Again, the operation of rod 225 will be discussed in more detail in conjunction with FIGS. 6–8.

Figure 4:
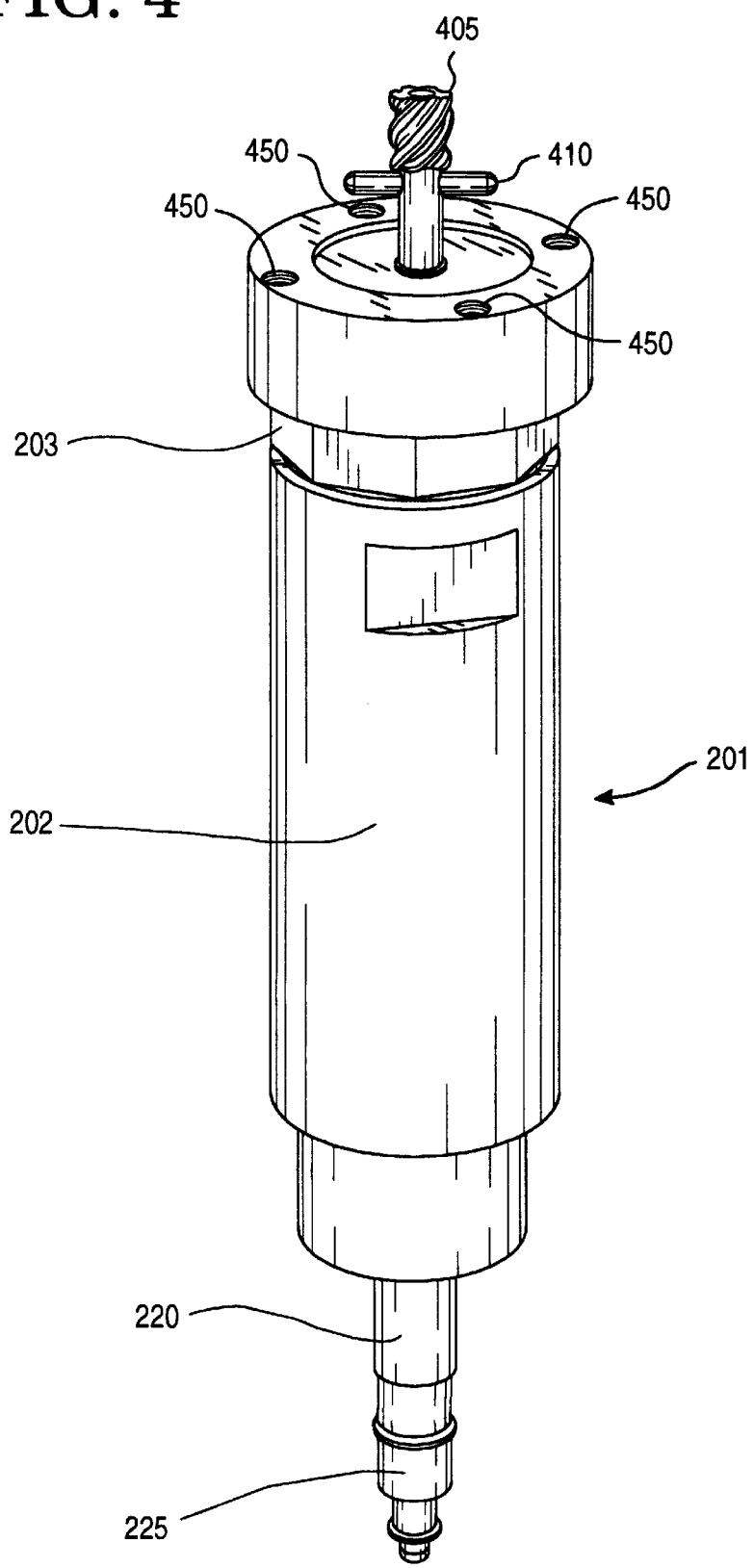
FIG. 4 illustrates a portion of the internal mechanism of the wafer holder and spindle assembly of a currently preferred embodiment of the present invention.

FIG. 4 shows spindle assembly 201 with head 204 removed so that the upper portion of rod 225 disposed within head 204 is visible. As can be seen, the upper portion of rod 225 comprises a helix 405 in a currently preferred embodiment. Also as shown, pin 410 extends through rod 225. Pin 410 mates in a slot in head 203, shown in FIG. 5. Screws 250 of FIG. 2 screw into screw holes 450 at the top of spindle assembly 201 to attach head 204 and wafer holder 200 to spindle assembly 201.

Figure 5:
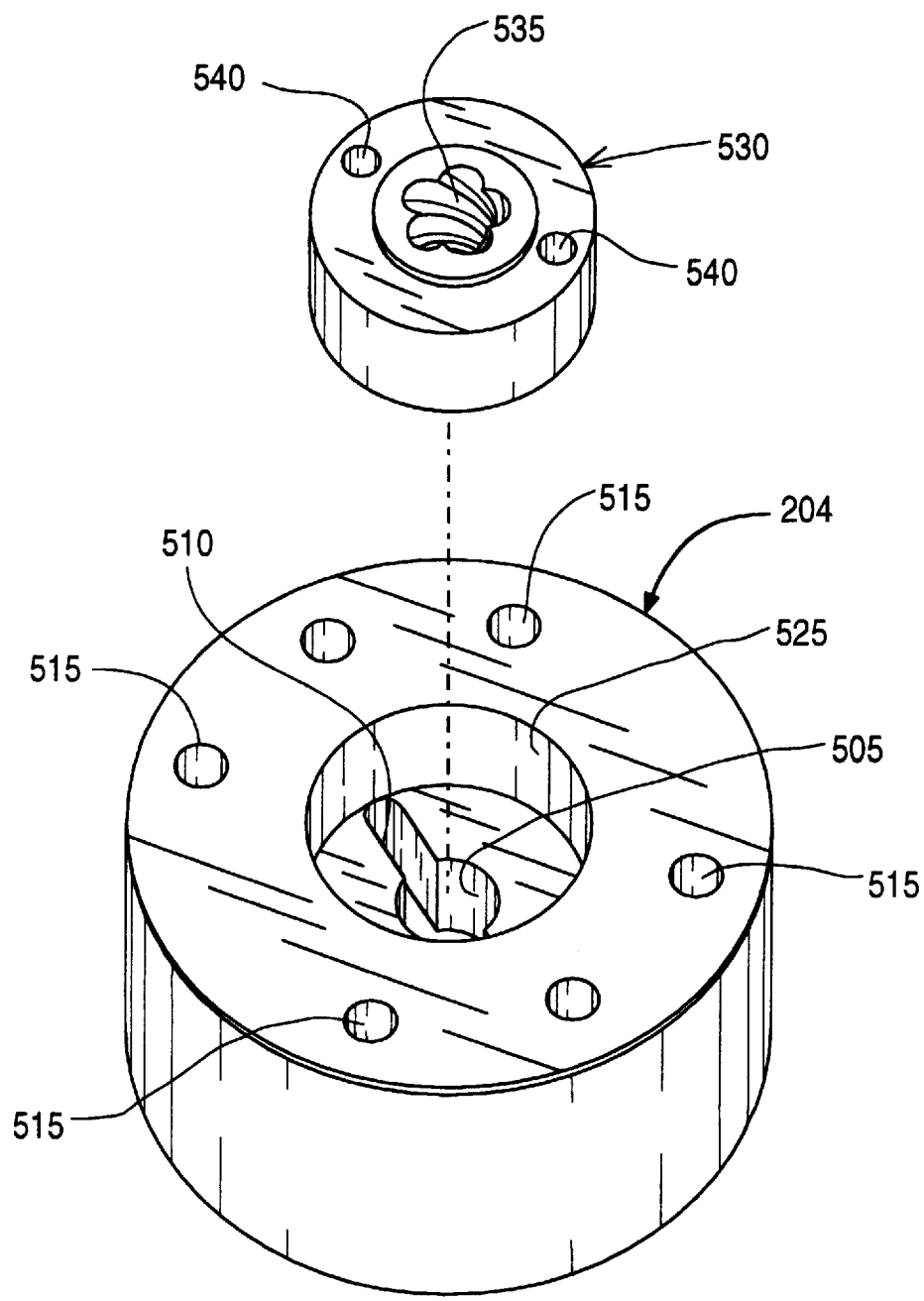
FIG. 5 shows a further internal portion of the substrate holder and spindle assembly of a currently preferred embodiment of the present invention.

Referring to FIG. 5, an exploded top-down view of head 204 and insert 530, removed from spindle assembly 201 and with wafer holder 200 removed, is shown. When head 204 is placed atop spindle assembly 201, helix 405 is inserted (from below) into opening 505 while pin 410 is inserted into slot 510. As mentioned earlier, rod 225 is movable up and down within spindle 220 to open and close wafer holder 200. In a currently preferred embodiment, when rod 225 is in the up position, the upper portion of helix 405 of FIG. 4 extends a slight distance above the upper surface of opening 525, and pin 410 of FIG. 4 is disposed near the upper portion of slot 510. Also in a currently preferred embodiment, when rod 225 is in the down position, the upper portion of helix 405 extends slightly above the top of opening 510, while pin 410 remains disposed within slot 510, near the lower portion thereof. It will be appreciated that many variations on the positioning of components as described in a currently preferred embodiment may be made by one of skill in the art. As can be seen, both the opening 505 and slot 510 are disposed in the lower portion of head 204, with opening 525 disposed in an upper portion.

Also shown in FIG. 5 is insert 530. As shown, insert 530 is disposed within opening 525 of head 204. Insert 530 comprises helical groove 535 and openings 540. When insert 530 is disposed within recess 525 of head 204, helical groove 535 mates with helix 405. When rod 225 is in the down position as shown in FIG. 2, the top of helix 405 is disposed near a lower portion of helical groove 535. When rod 225 is in the up position shown in FIG. 3, the top of helix 405 is disposed approximately flush with the upper surface of insert 530. In this regard, it should be noted that pin 410 shown in FIG. 4 remains within slot 510 during the entire up and down motion. This prevents rotation of rod 525 as it is pushed up and down so that all rotational motion is translated into insert 530. Thus, when rod 525 is pushed in the upward direction, insert 530 rotates in a clockwise direction, and when rod 525 is pulled in a downward direction, insert 530 rotates in a counter-clockwise direction.

Note that when head 204 is coupled to wafer holder 200 and spindle assembly 201 as shown, for example, in FIGS. 2 and 3, by placing screws 251 through openings 250 of housing 210, openings 515 of head 204 and into screw holes 450, wafer holder 200 is disposed on top of insert 530. This prevents upward motion of insert 530 as rod 225 is moved upward, so that the above described rotational movement of insert 530 occurs. As will be discussed below, insert 530 is coupled to the earlier described arms of wafer holder 200 via openings 540.

It should also be noted that insert 530 fits in recess 525 with a sufficient amount of clearance such that there is little frictional engagement of insert 530 with head 204 around the perimeter. Since there is only minimal frictional contact of insert 530 with head 204, and since the combined weight of head 204 and wafer holder 200 is much greater than that of insert 530, the resistance to any rotational movement of head 204 is much greater than that of insert 530, such that essentially all rotational motion as rod 225 moves up and down is translated into insert 530, and essentially none is transferred into the head 204/wafer holder 200 combination.

Figure 6:
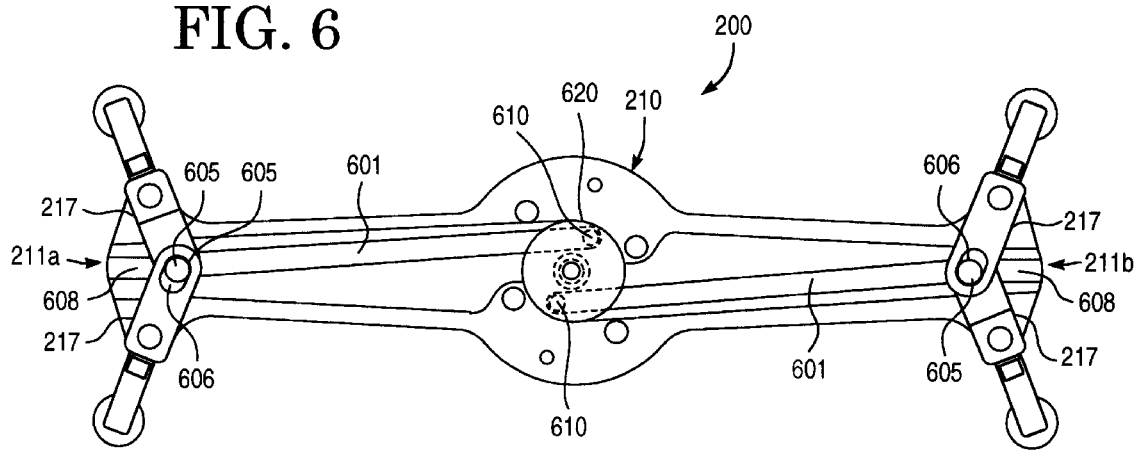
FIG. 6 shows a view of the underside of the substrate holder of a currently preferred embodiment of the present invention in the open position.
Figure 7:
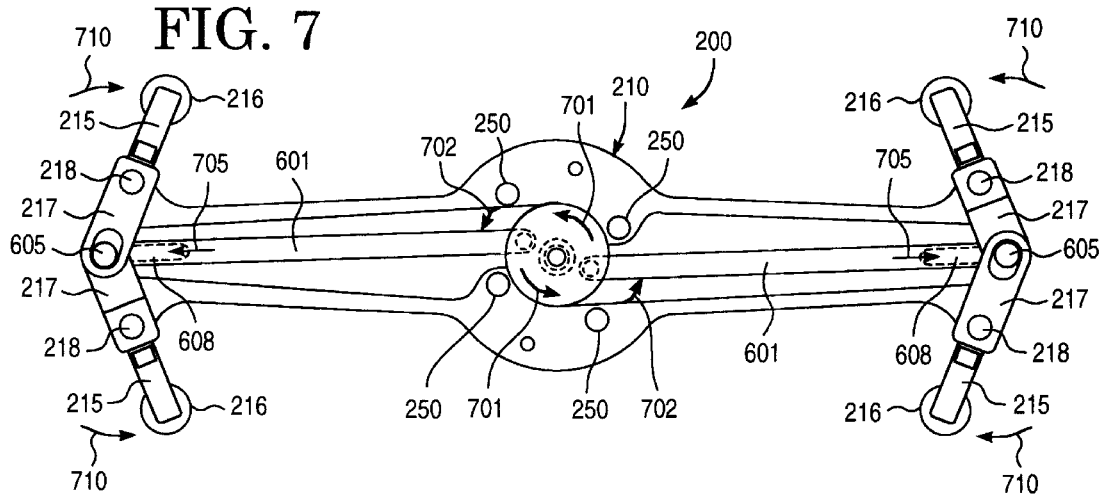
FIG. 7 shows the underside of the substrate holder of a currently preferred embodiment of the present invention in a partially closed position.
Figure 8:
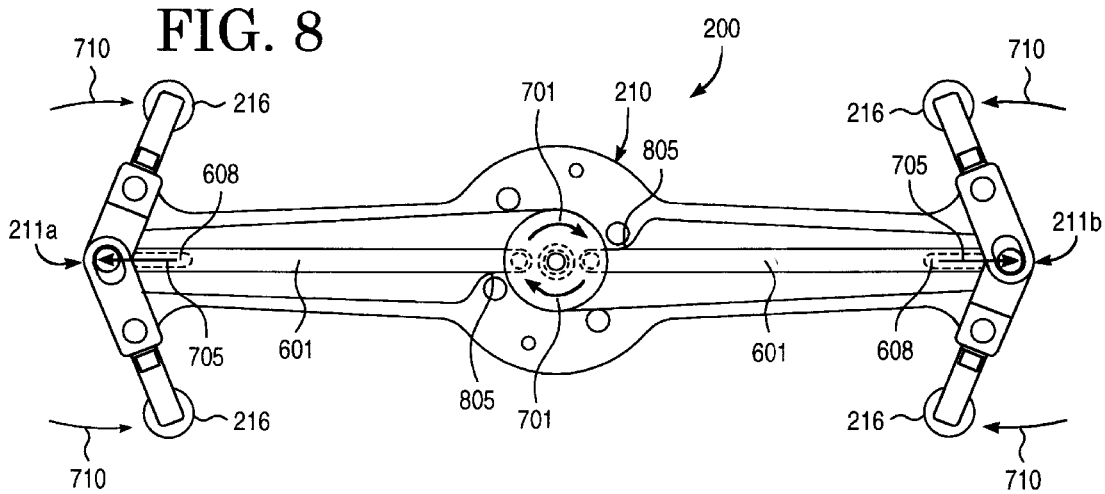
FIG. 8 shows the underside of the substrate holder of a currently preferred embodiment of the present invention in the closed position.

FIGS. 6–8 shows the bottom side of wafer holder 200. In FIGS. 6–8, wafer holder 200 is upside down with respect to the position shown in FIGS. 2 and 3. In the following discussion, various motions and movement of components shown in FIGS. 6–8 will be discussed as they appear in these Figures. It will be understood that these directions may be reversed compared to what is observed when wafer holder 200 is disposed right side up as shown in FIGS. 2 and 3. For example, clockwise motion of insert 530 as seen in FIG. 5 corresponds to counter-clockwise motion as seen in FIGS. 6–8, and vice-versa. Motions and movements discussed in relation to earlier Figures, will continue to be discussed as they appear in those Figures. For example, upward or downward motion of rod 225 of FIGS. 2 and 3 refers to upward and downward in relation to the orientation shown in FIGS. 2 and 3.

As shown in FIG. 6, wafer holder 200 comprises two arms 601 each attached to both of shafts 217 of a single wafer holding member 211. The arms 601 are each coupled to the pivoting arms 217 via pin 605. Each pin 605 is attached to an arm 601 and extends through an opening (not shown) in the bottom pivoting arm 217 and then through a similar opening 606 in the top pivoting arm 217. As shown, a pin 610 is disposed at the opposite end of each of arms 601. Pins 610 extend in both an upward and a downward direction from arms 601. The portions of pins 610 extending in an upward direction mate into openings 540 of insert 530 shown in FIG. 5. The portions of pins 610 that extend in a downward direction rest on the bottom of recess 620 of housing 210. Insert 530, in a currently preferred embodiment, is made of Tercite™, and may easily turn within recess 620. As illustrated in FIG. 6, wafer holder 200 is in an open position when arms 601 are in the position shown. With wafer holder 200 in the position shown in FIG. 6, rod 225 is in the fully down position shown in FIG. 2.

Referring to FIG. 7, as the rod 225 of FIG. 2 is pushed up, insert 530 rotates clockwise as viewed in FIG. 5 (counter-clockwise as viewed in FIG. 7). Arms 601 are coupled to insert 530 by pins 610 inserted in openings 540 of insert 530. This causes the ends of arms 601 attached thereto to rotate counter-clockwise as shown by arrows 701 and 702 in FIG. 7. This rotational movement is translated into essentially lateral (or horizontal) motion of the arms 601 as shown by arrows 705, such that arms 601 and pin 605 push both of the pivoting arms 217 in an outward direction, which pivot about pins 218. As each pivoting arm 217 is fixedly attached to the pin 218, this pivoting motion causes each pin 218 to rotate. Further, each L-shaped member 215 is similarly fixedly attached to the pin 218, so that the rotation of pin 218 causes L-shaped member 215 to swing in as shown by arrows 710. Note that in the position shown in FIG. 7, wafer holder 200 is in a partially closed position wherein a wafer may be held. When in this "partially closed" position, a vector force exists which will rotate insert 530, but is insufficient to overcome the force exerted by spring 950 (of FIG. 9) which will be discussed in greater detail below.

Referring to FIG. 8, wafer holder 200 is shown in a completely closed position (closed position) wherein no wafer is held. In a currently preferred embodiment, rod 225 in its fully up position rotates insert 530 of FIG. 5 such that the insert 530 has reached an apex. Note that the movement of arms 601 in the direction of arrows 701 is limited by contact with housing 210 at the points 805. Thus, insert 530 cannot continue to rotate any further in this direction nor can arm 601 move any further in this direction.

It should be noted that the lateral change in position of arms 601 between the position shown in FIGS. 7 and 8 is relatively small, so that the wafer holding members 211 move only a slight amount between the positions shown in FIGS. 7 and 8. In other words, the partially closed position of the wafer holder 200 actually comprises a range of positions depending on wafer diameter variations. The wafer holder 200 is designed such that when the components are within the position shown in FIG. 7 and before reaching the position shown in FIG. 8, the wafer is firmly grasped by all bumpers 216 of wafer holding members 211.

When wafer holder 200 is in the completely closed position as illustrated in FIG. 8, no wafer may be present. At the point illustrated in FIG. 8, if a wafer were present, the wafer may warp or break due to the force the wafer holding member exerts on the wafer. As will be discussed later, if wafer holder 200 reaches the completely closed position a mechanism may be put in place to inform the operator or system that no wafer is present.

To release a wafer, rod 225 is pulled in a downward direction. This rotates the insert 530 counter-clockwise as viewed in FIG. 5, causing arms 601 to rotate counter-clockwise, i.e., in the opposite direction of that shown in the sequence from FIGS. 6–8. Of course, in use, the opening of wafer holder 200 occurs only after the spindle assembly has stopped all spinning motion, positioned the flat of the wafer in a predetermined position, if desired, and after some type of transport mechanism, such as that described earlier, has moved into position to remove the wafer from the wafer holder 200.

Figure 9:
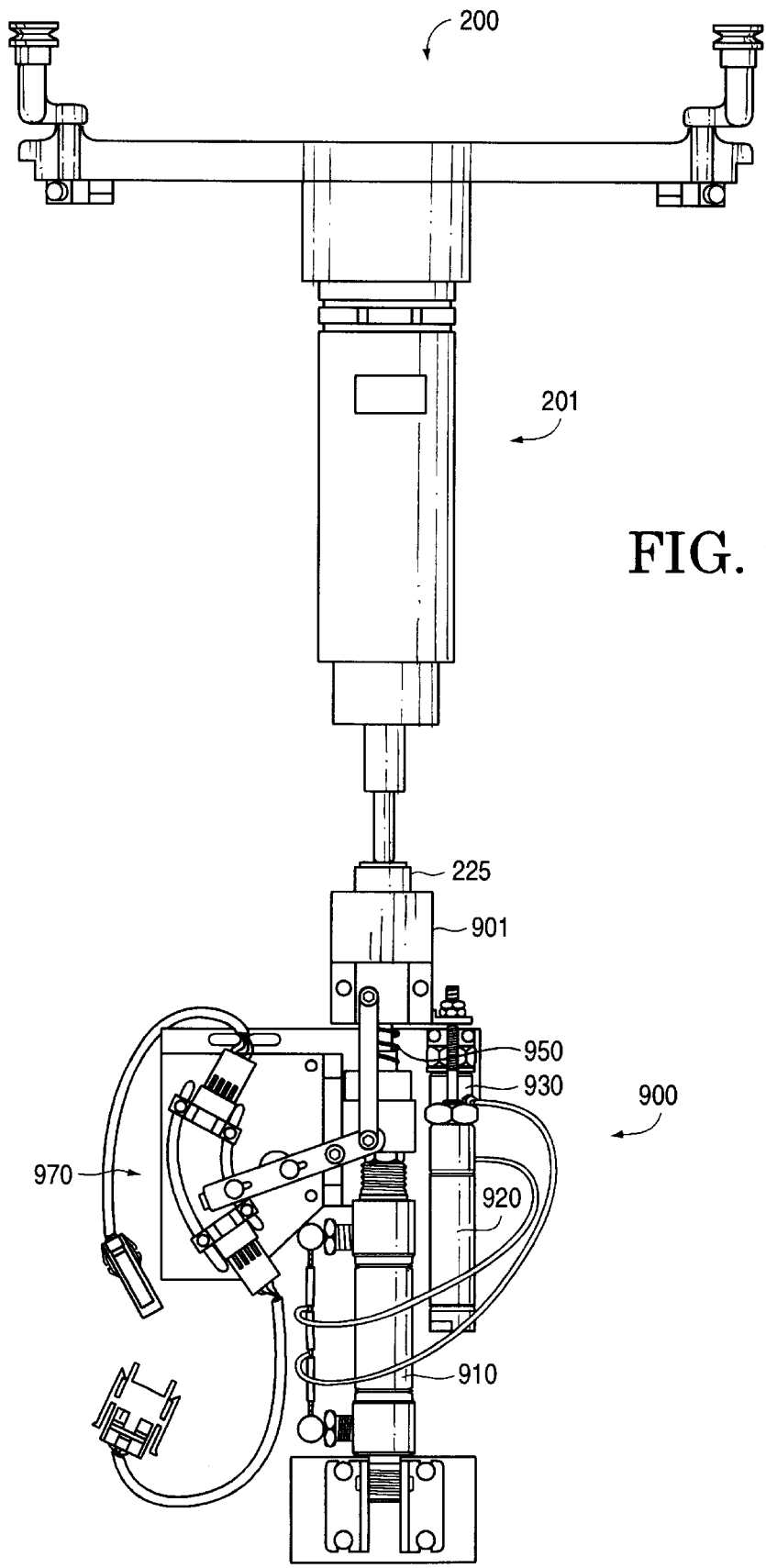
FIG. 9 illustrates an isometric view of a wafer holder with spindle assembly and wafer holder actuator of a currently preferred embodiment of the present invention.
Figure 10:
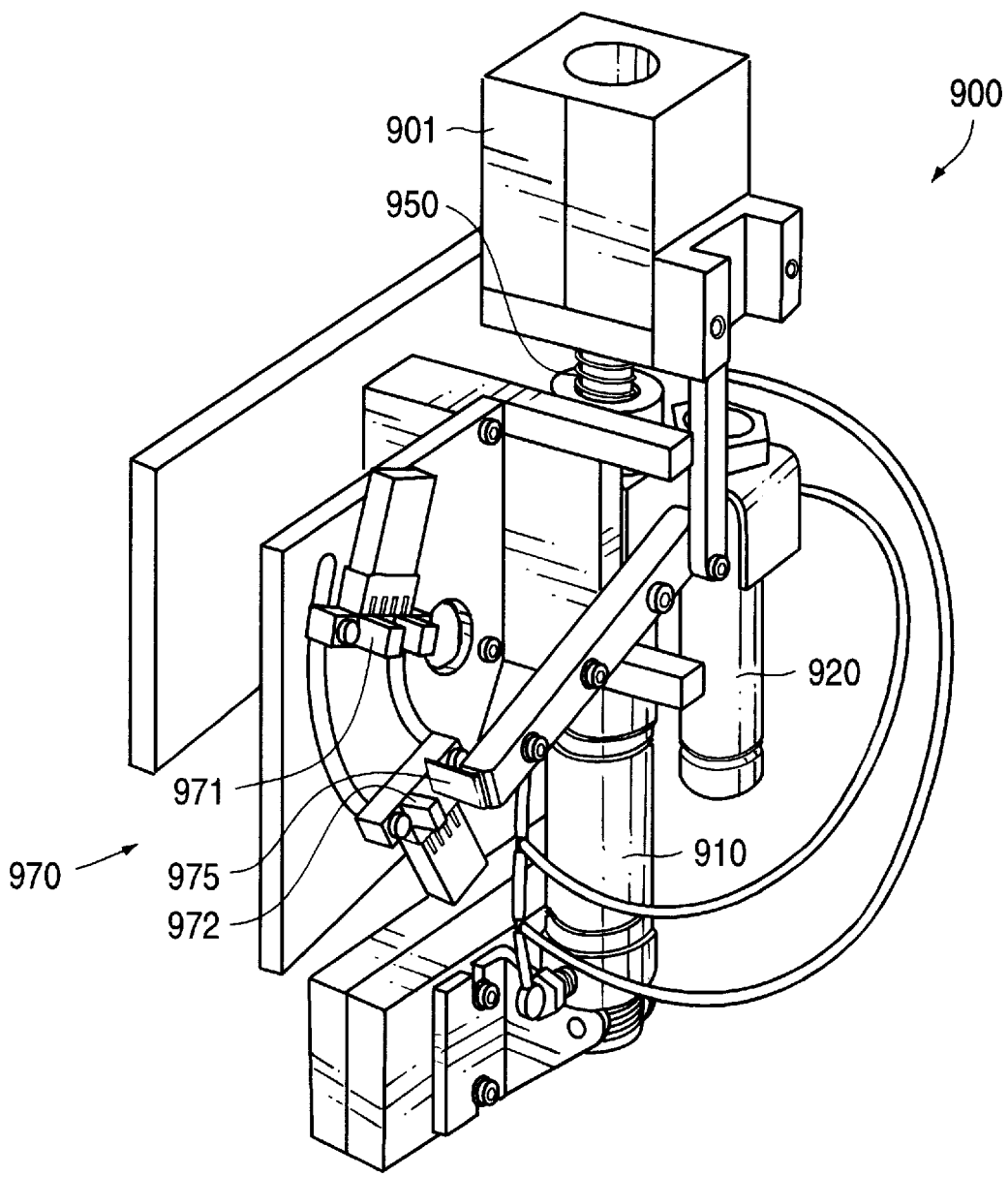
FIG. 10 illustrates an isometric side-view of a wafer holder actuator of a currently preferred embodiment of the present invention.
Figure 11:
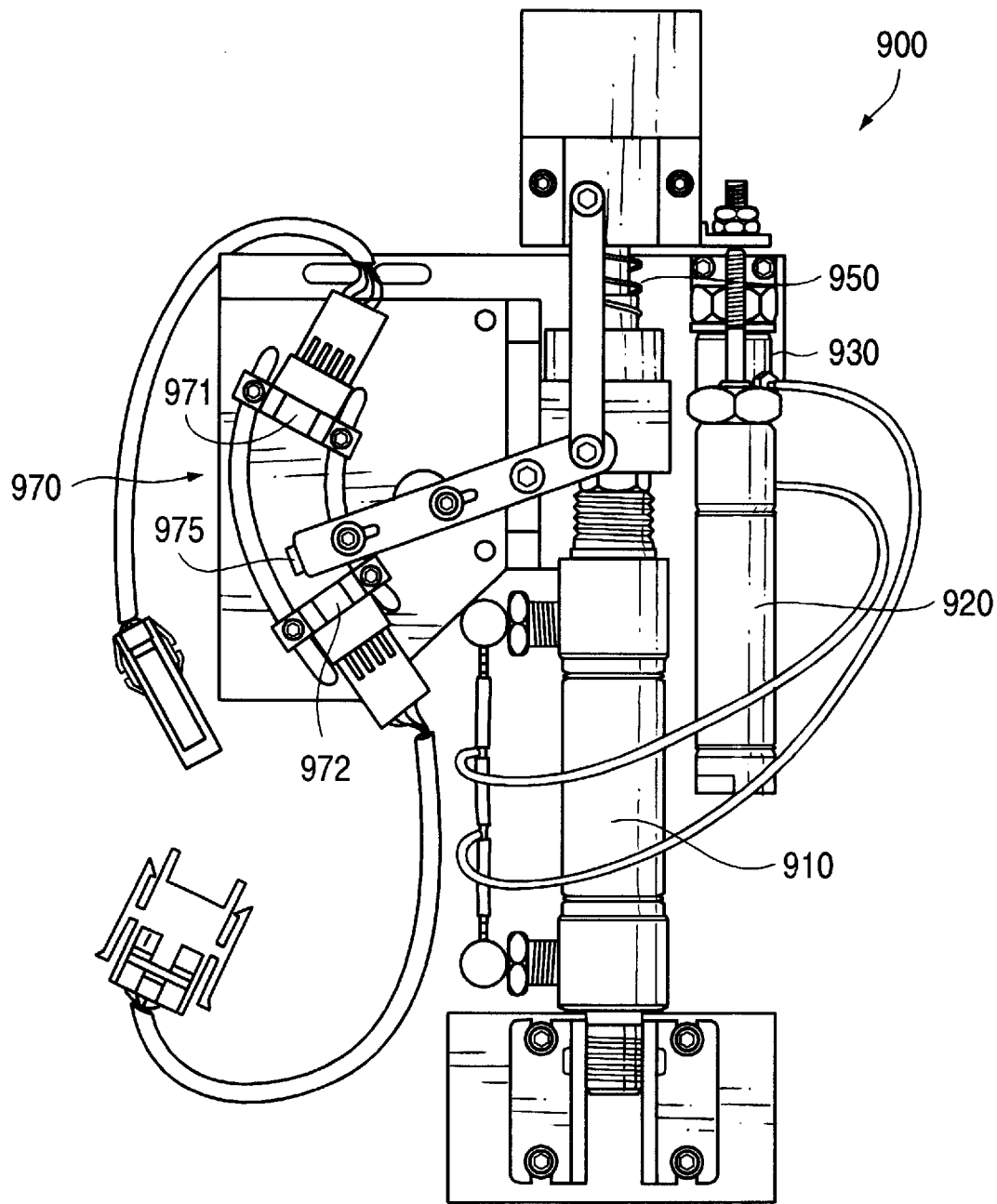
FIG. 11 illustrates an isometric front-view of a wafer holder actuator of a currently preferred embodiment of the present invention.

The opening and closing of wafer holder 200 is controlled by the vertical (i.e. up and down) motion of rod 225 and the motion of rod 225 may be controlled by an actuator, such as wafer holder actuator (actuator) 900, illustrated in FIG. 9.

FIGS. 10–13 illustrate various views of actuator 900 and are discussed in more detail below.

FIG. 9 shows a currently preferred embodiment of wafer holder 200 and spindle assembly 201 coupled to wafer holder actuator 900. Rod 225 of spindle assembly 201 is coupled to actuator 900 via coupling 901. Coupling 901 is moved up, thereby moving rod 225 up, by engagement cylinder 910 and spring 950. Coupling 901 is moved down, thereby moving rod 225 down, by retracting cylinder 930. In one currently preferred embodiment engagement cylinder 910 and retracting cylinder 930 are activated using air pressure. When engagement cylinder 910 expands it presses against spring 950. Spring 950 in turn presses up against coupling 901 with a force, k, which corresponds to the force constant of spring 950. In other words, the force constant of spring 950 translates into the force that is exerted on coupling 901 and rod 225 which corresponds to the force that wafer holder 200 exerts on the wafer.

In one currently preferred embodiment spring 950 is a compression spring. Spring 950 is selected such that it has a force constant, k, which is just enough force to allow wafer holder 200 to slightly squeeze the wafer. In other words, spring 950 is selected with a large enough force constant that wafer holder 200 is able to hold the wafer in place such that the wafer is not loose, but not too large a force constant that wafer holder 200 would squeeze the wafer too tightly thereby causing the wafer to warp or break.

By using a spring in conjunction with an air pressure activated engagement cylinder 910 to push up on rod 225 and thereby close wafer holder 200 on a wafer, the force exerted by wafer holder 200 on that wafer remains relatively constant. Once engagement cylinder 910 expands and engages spring 950, spring 950 pushes coupling 901 and rod 225 up with the force k. If the air pressure activating engagement cylinder 910 fluctuates (i.e. goes up and down) thereby causing engagement cylinder to exert more or less force on spring 950, the force exerted by the spring 950 on the coupling 901 will be unaffected provided the air cylinder 910 has sufficient pressure to reach its fully extended position. Thus, the force exerted on the wafer by wafer holder 200 remains constant and the wafer will not be damaged.

In order to release the wafer (i.e. place wafer holder 200 in the open position), engagement cylinder 910 must be disengaged allowing spring 950 to decompress. One currently preferred embodiment of the present invention uses retracting cylinder 930 to assist the disengagement of engagement cylinder 910. Retracting cylinder 930 is coupled to coupling 901 such that when retracting cylinder 930 retracts it forces coupling 901 to retract as cyllinder 910 retracts. In other words, as retracting cylinder 930 retracts, engagement cylinder contracts and spring 950 decompresses. When spring 950 decompresses to the point where it no longer exerts a force on coupling 901 and rod 225, coupling 901 and rod 225 move downward thereby placing wafer holder 200 in an open position. It should be noted and it will be obvious to one with ordinary skill in the art that other methods may be used to decompress spring 950 and disengage engagement cylinder 910 in order to lower coupling 901 and rod 225, for example, depressurizing engagement cylinder 910.

Figures 12, 13:
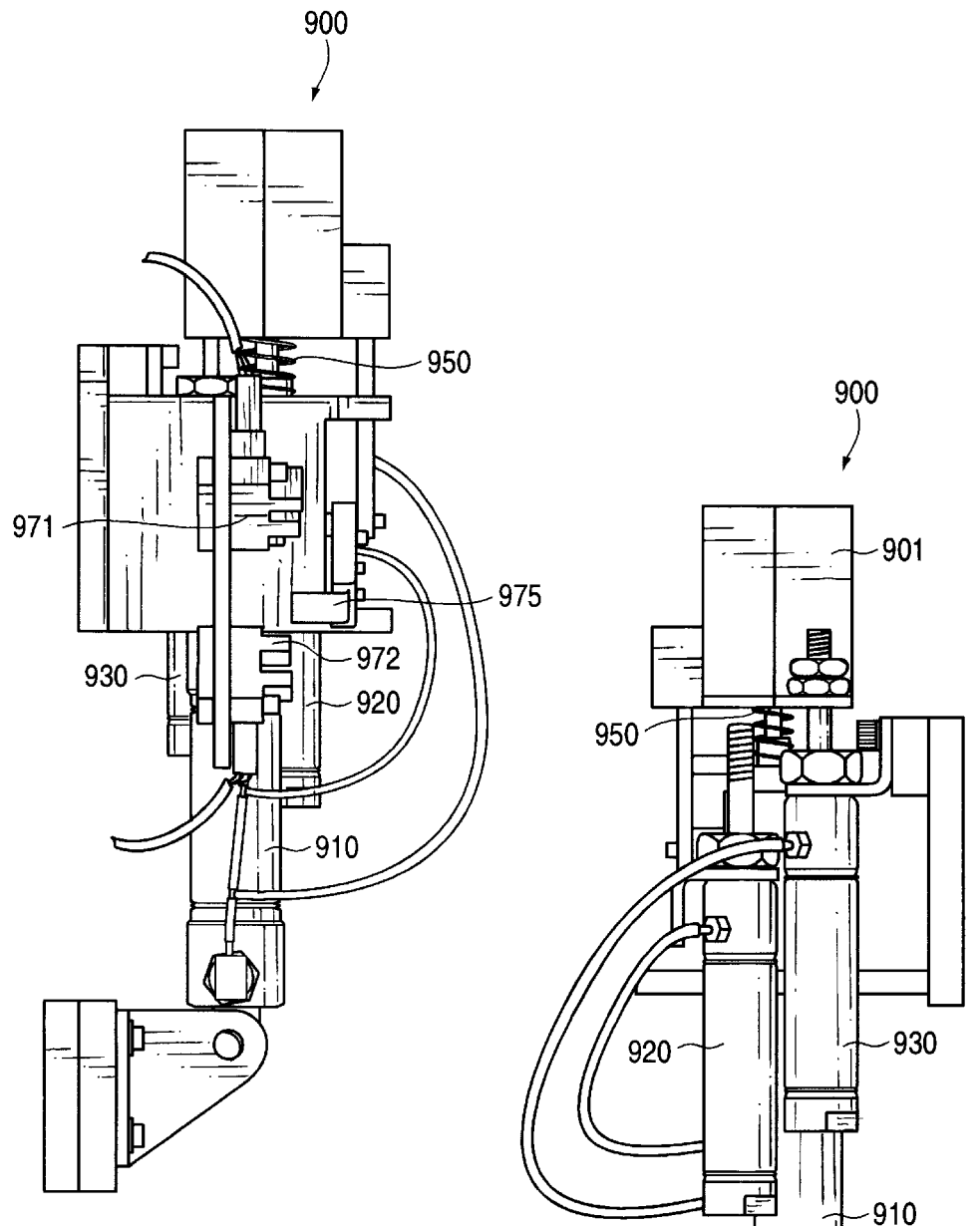
FIGS. 12 and 13 illustrate isometric side-views of opposite sides of a wafer holder actuator of a currently preferred embodiment of the present invention.

In another preferred embodiment, actuator 900 may also have a third cylinder, such as auxiliary cylinder 920 shown in FIG. 13. Auxiliary cylinder 920 is also an air pressure activated cylinder and may be used as a fail-safe or backup cylinder to engagement cylinder 910. If the air pressure of engagement cylinder 910 somehow fails, for example an air tube leaks, is crimped, or etc., and engagement cylinder 910 is no longer able to expand enough to hold rod 225 up, auxiliary cylinder 920 kicks in to maintain rod 225 in the up position so that the wafer will not be dropped. In one embodiment of the present invention auxiliary cylinder 920 is a spring loaded cylinder. It should be noted and it will be obvious to one with ordinary skill in the art that auxiliary cylinder may be placed such that it engages spring 950 (not shown) or such that it engages coupling 901 directly (FIG. 13) thereby holding rod 225 in the up position (i.e. wafer holder 200 is in a closed position). Auxiliary cylinder 930 may be disengaged or retracted using similar methods as described above in relation to engagement cylinder 910.

Another embodiment of the present invention may also include a wafer sensor assembly that will aid the computer system or system operator in detecting when a wafer is actually being held by wafer holder 200. FIGS. 9–12 illustrate one embodiment of a wafer sensor assembly, wafer sensor assembly 970, attached to actuator 900. Refering to FIG. 11, one embodiment of wafer sensor assembly 970 illustrated in FIG. 11 has two sensors, sensor 971 and sensor 972. When coupling 901 is moved up and down (i.e. placing wafer holder 200 in a closed and open position, respectively) wafer sensor arm (arm) 975 is moved back and forth between sensors 971 and 972. In the embodiment of wafer sensor assembly 970 illustrated in FIG. 11, when coupling 901 moves down placing wafer holder 200 in an open position, such as that illustrated in FIG. 6, arm 975 moves up and triggers sensor 971. The triggering of sensor 971 indicates that a wafer holder 200 is ready to have a wafer loaded. When coupling 901 moves up placing wafer holder 200 in a closed position, such as that illustrated in FIG. 7, arm 975 moves to a position between sensors 971 and 972. If arm 975 triggers either sensor 971 or 972 this indicates that a wafer is not being held by wafer holder 200. It should be noted and it will be obvious to one with ordinary skill in the art that a third sensor (not shown) may be added between sensors 971 and 972 that may be triggered to indicate when a wafer is held by wafer holder 200. When coupling 901 moves up placing wafer holder 200 in a closed position, such as that illustrated in FIG. 8, arm 975 moves down and triggers sensor 972. The triggering of sensor 972 indicates that no wafer is present, thus telling the operator (or computer) that no wafer was delivered to wafer holder 200 or that the wafer delivered is damaged or broken. The operator (or computer) may then interrupt the system to determine what happened or to load another wafer.

Figures 1A, 1B:
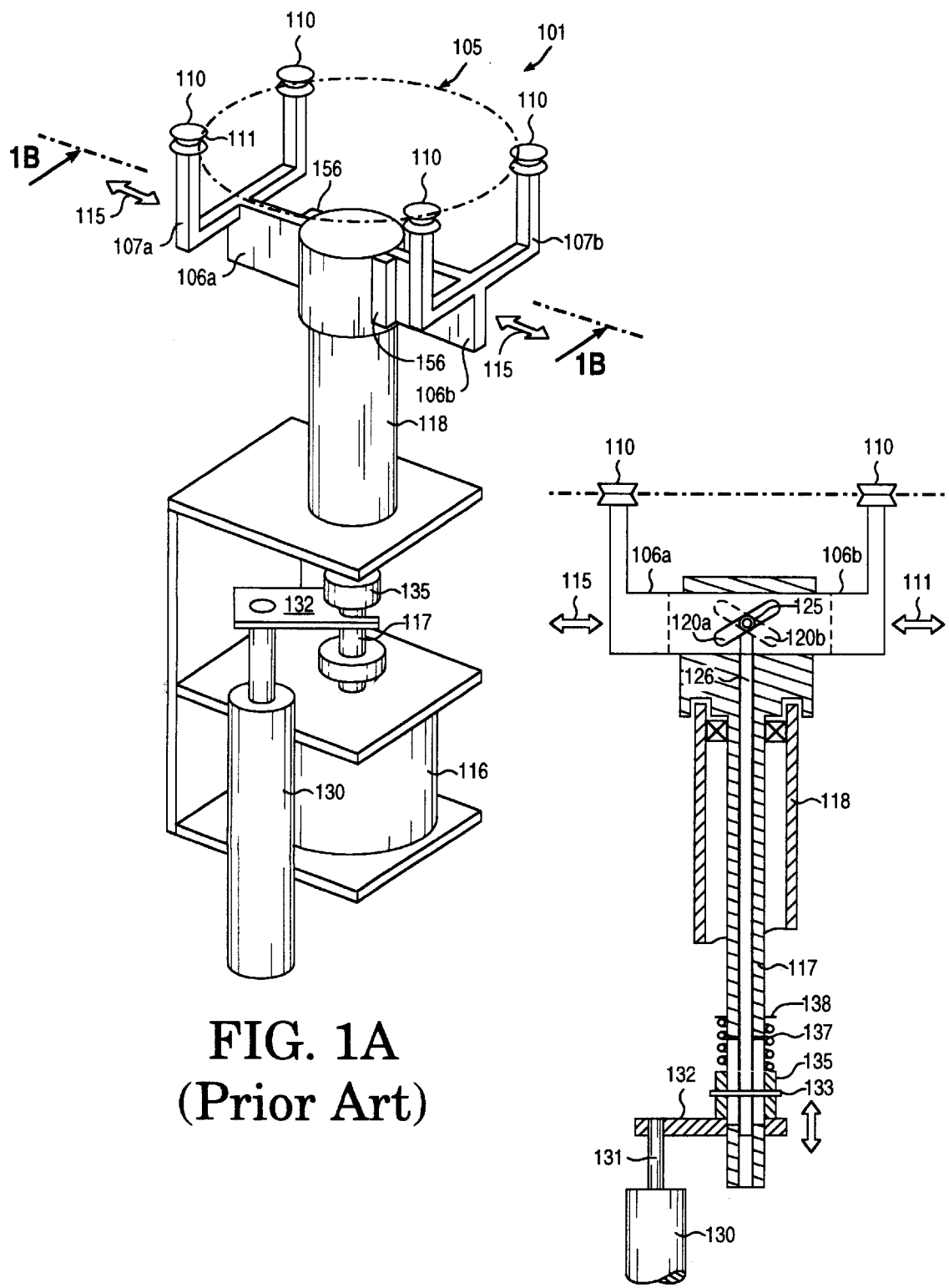
FIG. 1A illustrates an isometric view of a prior art spindle assembly and wafer holder.
FIG. 1B shows a cross-sectional view of the structure of FIG. 1A.

It will be appreciated that the specific embodiment shown and described herein need not be employed to practice the present invention. For example, although each wafer holding member 211 is illustrated as having two L-shaped members 215 coupled via various pins and arms to the arm 601, other wafer holding means or members may be used. For example, the wafer holding mechanism may comprise a single U-shaped member having two wafer holding bumpers similar to the members 107 of FIGS. 1A and 1B. As in the above described embodiment, the motion of the arms 601 should be prevented after the insert or similar mechanism has toggled to the apex in the closed position. In this regard it should be noted that in any embodiment of the present invention, the motion of the arms need not be limited by the configuration of the housing as shown and described above, but may be limited by other methods or devices such as set screws, tabs, etc.

Additionally, it will be appreciated that the motion of the arms need not be limited by direct contact with the arms themselves. Rather, movement of the arms may be limited by limiting further rotation of the insert 530 by similar methods or devices to those described above.

Furthermore, other alternative embodiments may be used. For example, although the preferred embodiment uses a rod inside a spindle to provide the rotational motion for the arms, the spindle may be disposed within the rod or shaft which provides the rotational motion for the arms. As another alternative, the insert 530 may comprise a male helix member protruding downward, while the rod comprises a helical groove to provide for the rotational motion of the insert. Alternatively, in place of the helix and helical groove, a bell crank or similar member, coupled to a rod such as rod 225, may be disposed in a position to turn a thrust bearing and/or alternatively to turn an insert such as insert 530 which may be coupled to the thrust bearing.

As a further alternative, other means may be used to provide the rotational motion described above. For example, the rod 225 may be turned instead of moved in an upward and downward direction to provide the rotation of the arms 601. In such an embodiment, the rod 225 may be coupled directly to the arms 601, or may coupled through a lead screw and lead nut combination. In such an embodiment, a motor may be coupled to the rod 225 via a belt to provide the turning motion. However, an embodiment wherein up/down motion is translated to rotational motion is generally easier to implement. In this regard, although the wafer holder in the embodiment described above is closed when the rod is in the up position and open when the rod is in the down position, it will be appreciated that, if desired, the wafer holder may be open with the rod in the up position and closed with the rod in the down position in any embodiment of the present invention. Finally, numerous other modifications and substitution of components will be apparent to one of ordinary skill in the art.

Thus, an Improved Wafer Holder with Spindle Assembly and Wafer Holder Actuator has been described. Although specific embodiments, including specific equipment, configurations, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

What is claimed is:

1. A substrate holder comprising:
   a shaft, wherein said shaft moves in a vertical motion;
   an arm positioning member coupled to said shaft, wherein said arm positioning member moves in a rotational motion when said shaft moves in said vertical motion;
   an arm coupled to said arm positioning member at a first position of said arm, wherein said arm moves in a substantially horizontal motion when said arm positioning member moves in said rotational motion;
   a substrate holding member coupled to said arm at a second position of said arm, wherein said horizontal motion of said arm moves said substrate holding member between an open and a closed position; and
   an actuator coupled to said shaft, wherein said actuator moves said shaft in said vertical motion, and wherein said actuator comprises:
   a first cylinder, said first cylinder engaging a spring; and
   a second cylinder, said second cylinder disengaging said first cylinder from said spring.

2. The substrate holder as described in claim 1 wherein said shaft moves in an upward vertical motion to place said substrate holding member in said closed position and in a downward vertical motion to place said substrate holding member in said open position.

3. The substrate holder as described in claim 1 wherein an outward force applied to said substrate holding member when said substrate holding member is in said closed position does not cause rotation of said arm positioning member.

4. The substrate holder as described in claim 1 wherein one of said shaft and said arm positioning member comprises a helix, and the other of said shaft and said arm positioning member comprises a helical groove, such that the vertical motion of said shaft in a first vertical motion rotates said arm positioning member in a first rotational direction, and vertical motion of said shaft in a second vertical motion rotates said arm positioning member in a second rotational direction, to move said arm positioning member to position said substrate holding member in said open and said closed position.

5. The substrate holder as described in claim 4 wherein said first vertical motion of said shaft is an upward vertical motion thereby placing said substrate holding member in said closed position, and wherein said second vertical motion of said shaft is a downward vertical motion thereby placing said substrate holding member in said open position.

6. The substrate holder as described in claim 1 wherein said substrate holder is coupled to a spindle, said spindle rotatable about an axis.

7. The substrate holder as described in claim 6 wherein one of said spindle and said shaft is disposed within the other of said spindle and said shaft.

8. The substrate holder as described in claim 1 wherein said actuator, wherein
said first cylinder engages said spring when said first cylinder is expanded, said spring engaging said shaft, thereby pushing said shaft upward; and
said second cylinder disengaging said first cylinder from said spring when said second cylinder is retracted, wherein said first cylinder retracts and said spring decompresses, thereby allowing said shaft to move downward.

9. The substrate holder as described in claim 1 wherein said spring of said substrate holder actuator is a compression spring.

10. The substrate holder as described in claim 1 wherein said actuator further comprises a third cylinder, said third cylinder acting as a fail safe cylinder to back up said first cylinder if said first cylinder fails.

11. The substrate holder as described in claim 10 wherein said third cylinder of said actuator engages said shaft of said spindle assembly when said third cylinder is expanded, thereby holding said shaft in an upward position, and wherein said third cylinder retracts, thereby allowing said shaft to fall downward.

12. The substrate holder as described in claim 1 wherein said actuator further comprises a wafer sensor assembly having a first sensor and a second sensor, said first sensor detecting when said substrate holder is in a closed position and said second sensor detecting when said substrate is in an open position.

13. The substrate holder as described in claim 12 wherein said wafer sensor assembly of said actuator includes a third sensor for detecting that said substrate holder is in a closed position and that a wafer is held in said substrate holder.

14. A substrate holder actuator comprising:
a first cylinder, said first cylinder engaging a spring when said first cylinder is expanded, said spring engaging a shaft of a spindle assembly, thereby pushing said shaft upward; and
a second cylinder, said second cylinder disengaging said first cylinder from said spring when said second cylinder is retracted, wherein said first cylinder retracts and said spring decompresses, thereby allowing said shaft to move downward.

15. The actuator as described in claim 14 wherein said spring is a compression spring.

16. The actuator as described in claim 14 wherein said actuator further comprises a third cylinder, said third cylinder acting as a fail safe cylinder to back up said first cylinder if said first cylinder fails.

17. The actuator as described in claim 16 wherein said third cylinder engages said shaft of said spindle assembly when said third cylinder is expanded, thereby holding said shaft in an upward position, and wherein said third cylinder retracts, thereby allowing said shaft to move downward.

18. The actuator as described in claim 14 wherein said actuator further comprises a wafer sensor assembly having a first sensor and a second sensor, said first sensor detecting when said substrate holder is in a closed position and said second sensor detecting when said substrate is in an open position.

19. The actuator as described in claim 18 wherein said wafer sensor assembly includes a third sensor for detecting that said substrate holder is in a closed position and that a wafer is held in said substrate holder.

20. A substrate holder and actuator assembly comprising:
said substrate holder having:
a spindle;
a shaft;
an arm positioning member coupled to said shaft;
an arm coupled to said arm positioning member at a first position of said arm;
a substrate holding member coupled to said arm at a second position of said arm;
said actuator assembly having:
a spring;
a first cylinder, said first cylinder engaging said spring when said first cylinder is expanded, said spring engaging said shaft of said substrate holder, wherein said spring pushes said shaft in an upward vertical motion thereby placing said substrate holding member in a closed position; and
a second cylinder, said second cylinder disengaging said first cylinder from said spring when said second cylinder is retracted, wherein said spring decompresses allowing said shaft to move in a downward vertical motion thereby placing said substrate holding member in an open position.

21. The substrate holder and actuator assembly as described in claim 20 wherein an outward force applied to said substrate holding members when said substrate holding members are in said closed position does not cause rotation of said arm positioning member.

22. The substrate holder and actuator assembly as described in claim 21 wherein one of said shaft and said arm positioning member comprises a helix, and the other of said shaft and said arm positioning member comprises a helical groove, such that said upward vertical motion of said shaft rotates said arm positioning member in a first rotational direction, and said downward vertical motion of said shaft rotates said arm positioning member in a second rotational direction, to move said arm positioning member to position said substrate holding members in said open and said closed position.

23. The substrate holder and actuator assembly as described in claim 20 wherein said spindle is rotatable about an axis.

24. The substrate holder and actuator assembly as described in claim 20 wherein one of said spindle and said shaft is disposed within the other of said spindle and said shaft.

25. The substrate holder and actuator assembly as described in claim 20 wherein said spring of said actuator is a compression spring.

26. The substrate holder and actuator assembly as described in claim 20 wherein said actuator further comprises a third cylinder, said third cylinder acting as a fail safe cylinder to back up said first cylinder if said first cylinder fails.

27. The substrate holder and actuator assembly as described in claim 26 wherein said third cylinder of said actuator engages said shaft of said spindle assembly when said third cylinder is expanded, thereby holding said shaft in an upward position, and wherein said third cylinder retracts, thereby allowing said shaft to fall downward.

28. The substrate holder and actuator assembly as described in claim 20 wherein said actuator further comprises a wafer sensor assembly having a first sensor and a second sensor, said first sensor detecting when said substrate holder is in a closed position and said second sensor detecting when said substrate is in an open position.

29. The substrate holder and actuator assembly as described in claim 28 wherein said wafer sensor assembly of said substrate holder actuator includes a third sensor for detecting that said substrate holder is in a closed position and that a wafer is held in said substrate holder.

30. A substrate holder and actuator assembly comprising:
   said substrate holder having:
      a spindle, said spindle rotatable about an axis;
      a shaft, wherein one of said spindle and said shaft is disposed within the other of said spindle and said shaft;
      an arm positioning member coupled to said shaft;
      an arm coupled to said arm positioning member at a first position of said arm;
      a substrate holding member coupled to said arm at a second position of said arm;
   said actuator assembly having:
      a spring;
      a first cylinder, said first cylinder engaging said spring when said first cylinder is expanded, said spring engaging said shaft of said substrate holder, wherein said spring pushes said shaft in an upward vertical motion, wherein the upward vertical motion of said shaft causes said arm positioning member of said substrate holder to rotate, the rotational motion of said arm positioning member translating into outward horizontal motion of said arm, thereby placing said substrate holder in a closed position; and
      a second cylinder, said second cylinder disengaging said first cylinder from said spring when said second cylinder is retracted, wherein said spring decompresses allowing said shaft to move in a downward vertical motion, wherein the downward vertical motion of said shaft causes said arm positioning member of said substrate holder to rotate, the rotational motion of said arm positioning member translating into an inward horizontal motion of said arm, thereby placing said substrate holder in an open position.

31. The substrate holder and actuator assembly as described in claim 30 wherein said actuator further comprises a third cylinder, said third acting as a fail safe cylinder to back up said first cylinder if said first cylinder fails.

32. The substrate holder and actuator assembly as described in claim 31 wherein said third cylinder of said actuator engages said shaft of s assembly when said third cylinder is expanded, thereby holding said shaft in an upward position, and wherein said third cylinder retracts, thereby allowing said shaft to move downward.

33. The substrate holder and actuator assembly as described in claim 30 wherein said actuator further comprises a wafer sensor assembly having a first sensor and a second sensor, said first sensor detecting when said substrate holder is in a closed position and said second sensor detecting when said substrate is in an open position.

34. The substrate holder and actuator assembly as described in claim 33 wherein said wafer sensor assembly of said substrate holder actuator includes a third sensor for detecting that said substrate holder is in a closed position and that a wafer is held in said substrate holder.

* * * * *